United States Patent
Hsu et al.

(10) Patent No.: US 7,320,897 B2
(45) Date of Patent: Jan. 22, 2008

(54) ELECTROLUMINESCENCE DEVICE WITH NANOTIP DIODES

(75) Inventors: Sheng Teng Hsu, Camas, WA (US); Tingkai Li, Vancouver, WA (US); Wei-Wei Zhuang, Vancouver, WA (US)

(73) Assignee: Sharp Laboratories of Amrica, Inc., Camas, WA (US)

( * ) Notice: Subject to any disclaimer, the term of this patent is extended or adjusted under 35 U.S.C. 154(b) by 283 days.

(21) Appl. No.: 11/090,386

(22) Filed: Mar. 23, 2005

(65) Prior Publication Data
US 2006/0214172 A1 Sep. 28, 2006

(51) Int. Cl.
H01L 21/66 (2006.01)

(52) U.S. Cl. .......................... 438/20; 438/713; 977/834

(58) Field of Classification Search ................. 438/20; 977/811–834
See application file for complete search history.

(56) References Cited

U.S. PATENT DOCUMENTS

| 5,399,185 | A * | 3/1995 | Berthold et al. ............... 65/430 |
| 5,667,905 | A * | 9/1997 | Campisano et al. ......... 428/690 |
| 6,218,771 | B1 * | 4/2001 | Berishev et al. ............ 313/311 |
| 6,579,735 | B1 * | 6/2003 | Romano et al. .............. 438/20 |
| 2004/0056271 | A1 * | 3/2004 | Chen et al. ................... 257/152 |
| 2006/0181197 | A1 * | 8/2006 | Nago et al. .................. 313/503 |

OTHER PUBLICATIONS

J. Ruan, et al, Optical Amplification in Nanocrystalline Silicon Superlattices, MRS 2002.
J. Ruan, et al, "Stimulated emission in nanocrystalline silicon Superlattices" APL 83, #26, p. 1-3, 2003.
A. Polman, J. Appl. Phys. 82 (1), Jul. 1997, p. 1-39.
H, Manohara, "A new method for fabricating random silicon nanotips" NanotechBriefs, Mar. 2004.

* cited by examiner

Primary Examiner—Carl Whitehead, Jr.
Assistant Examiner—Sonya D. McCall-Shepard
(74) Attorney, Agent, or Firm—Law Office of Gerald Maliszewski; Gerald Maliszewski

(57) ABSTRACT

A nanotip electroluminescence (EL) diode and a method are provided for fabricating said device. The method comprises: forming a plurality of Si nanotip diodes; forming a phosphor layer overlying the nanotip diode; and, forming a top electrode overlying the phosphor layer. The nanotip diodes are formed by: forming a Si substrate with a top surface; forming a Si p-well; forming an n+ layer of Si, having a thickness in the range of 30 to 300 nanometers (nm) overlying the Si p-well; forming a reactive ion etching (RIE)-induced polymer grass overlying the substrate top surface; using the RIE-induced polymer grass as a mask, etching areas of the substrate not covered by the mask; and, forming the nanotip diodes in areas of the substrate covered by the mask.

12 Claims, 4 Drawing Sheets

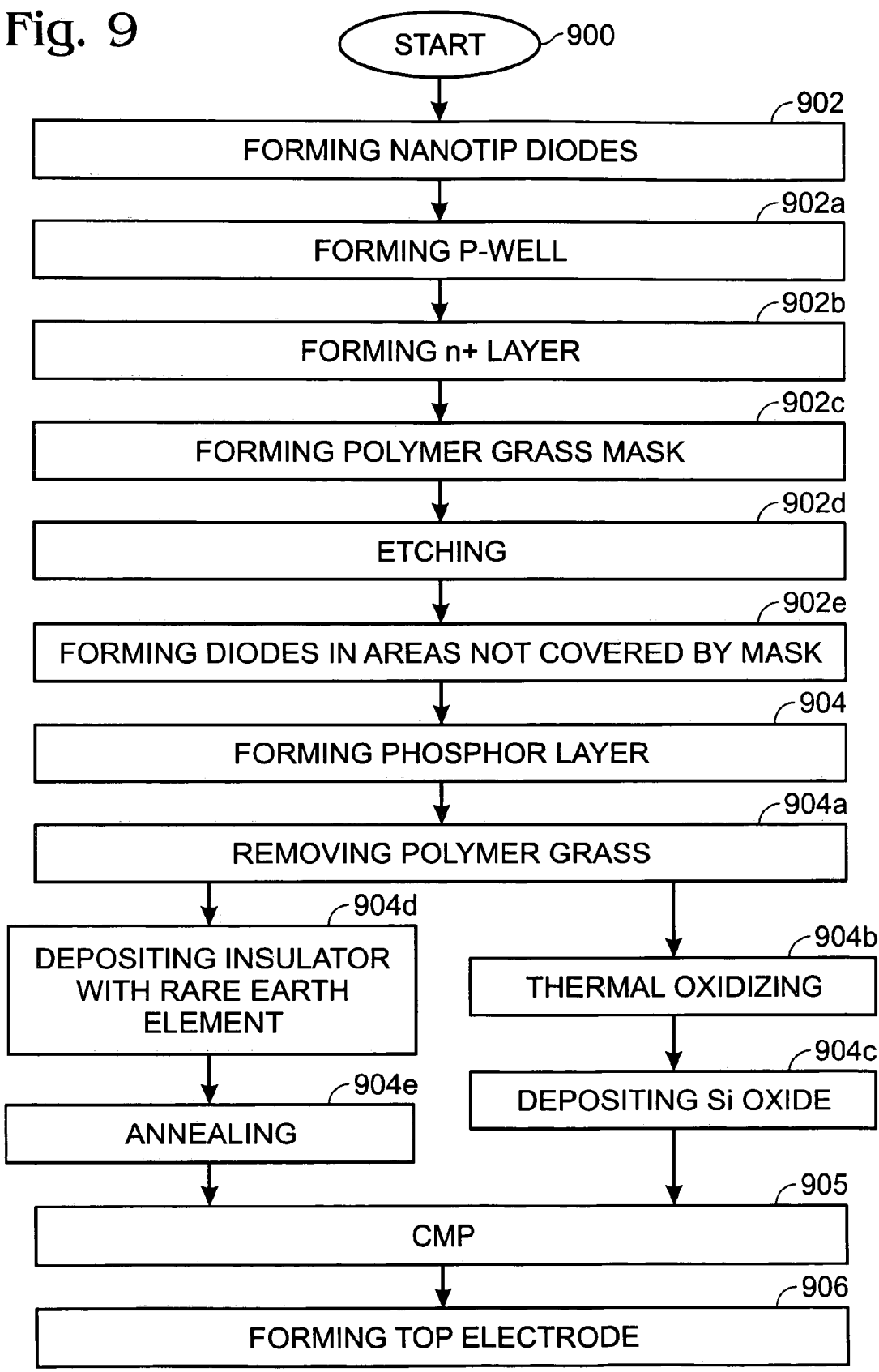

ELECTROLUMINESCENCE DEVICE WITH NANOTIP DIODES

BACKGROUND OF THE INVENTION

1. Field of the Invention

This invention generally relates to integrated circuit (IC) fabrication and, more particularly, to an electroluminescence device made using nanotips diodes.

2. Description of the Related Art

The generation of light from semiconductor devices is possible, regardless of whether the semiconductor material forms a direct or indirect bandgap. High field reverse biased p-n junctions create large hot carrier populations that recombine with the release of photons. For silicon devices, the light generation efficiency is known to be poor and the photon energy is predominantly around 2 eV. The conversion of electrical energy to optical photonic energy is called electroluminescence (EL). Efficient EL devices have been made that can operate with small electrical signals at room temperature. However, these devices are fabricated on materials that are typically not compatible with silicon, for example type III-V materials such as InGaN, AlGaAs, GaAsP, GaN, and GaP. An EL device built on one of these substrates can efficiently emit light in a narrow bandwidth within the visible region, depending on the specific material used. Additionally, type II-VI materials such as ZnSe have been used. Other type II-VI materials such as ZnS and ZnO are known to exhibit electroluminescence under ac bias conditions. These devices can be deposited onto silicon for use in light generating devices if special (non-conventional) CMOS processes are performed. Other classes of light emitting devices are organic light emitting diodes (OLEDs), nanocrystalline silicon (nc-Si), and polymer LEDs.

Generally, a diode is a semiconductor material with a varying ability to conduct electrical current. Impurities, or dopants, are often added to semiconductor material to improve conductivity. In the case of light-emitting diodes (LEDs), under forward bias conditions, electrons flow from the n-doped region to the p-doped region and recombine with holes. During the recombination process electrons loss energy that is either converted to optical energy and emitted as light, or converted to elastic energy and generated heat. Similarly, holes flow from p-doped region to n-doped region to recombine with electrons and emit light or generate heat.

A simple and efficient light-emitting device compatible with silicon, and which could be powered by a dc voltage, would be desirable in larger scale integrated circuits with embedded photonic devices (light emitting and light detecting) as the interconnecting means. Efficient silicon-based EL devices would enable a faster and more reliable means of signal coupling, as compared with conventional metallization processes. Further, for intra-chip connections on large integrated devices, the routing of signals by optical means is also desirable. For inter-chip communications, waveguides or direct optical coupling between separate silicon pieces would enable packaging without electrical contacts between chips. For miniature displays, a method for generating small point sources of visible light would enable simple, inexpensive displays to be formed.

J. Ruan et al. have proposed a structure of nano silicon superlattice light emission devices, formed from a multilevel of nano-silicon/oxide layers. The radiation center is the Si=O bonds. However, high voltage pulses with alternative polarities are required to generate electron-hole pairs.

Polman et al. have proposed doping silicon-based materials with Erbium (Er), to a density in the order of $10^{19}/cm^2$. The silicon-based materials can be pure Si, silicon oxide, doped silicon oxide, or glasses. This density of Er requires a co-doping of oxide to increase the Er solid solubility in Si. However, in order for the Er radiation centers to generate light, high-energy electrons and holes must be generated and injected into the Er-doped material.

It would be advantageous if a Si EL diode could be fabricated for low-power, high-density, large-scale IC applications.

SUMMARY OF THE INVENTION

The present invention is an EL device made using Si nanotip diode structures. Each nanotip is a silicon p/n junction, which in conjunction with a phosphor layer, can be used to form an LED. Briefly, the fabrication process includes (1) the growth of micro-etch masks on a silicon substrate, followed by (2) an etching away of the Si substrate, to make an array of sharp tips (nanotips).

In the first step of the process, a cleaned silicon substrate is subjected to reactive ion etching (RIE) in a certain mixture of oxygen and carbon tetrafluoride under radio frequency (RF) excitation. This process step results in the growth of fluorine based compounds in the form of stumps randomly distributed on the substrate. These stumps are known in the art as "RIE polymer grass." The dimensions of these stumps are no higher than hundreds of nanometers, the exact values depending on process time and gas composition. The aerial density of the stumps decreases in response to increasing the process time, as the stumps grow and merge with neighboring stumps. These stumps constitute the micro-etch masks for the next step of the process. In the second step of the process, the substrate, now covered with the micro-etch masks, is subjected to a reactive ion etching (RIE) process, which consists of cycles of reactive ion etching alternating with passivation (the Bosch process). The gas used in the etching sub-step can be sulfur hexafluoride (SF6); the gas used in the passivation sub-steps can be octafluorocyclobutane (C4F8). The portions of the substrate directly under the RIE grass stubs are not etched, while the portions between the stubs are etched. Hence, what remains at the end of the process, after the stubs and parts of the substrate have been etched away, are silicon spikes (nanotips) in regions formerly covered by the stumps.

Accordingly, a method is provided for fabricating a Si nanotip EL diode. The method comprises: forming a plurality of Si nanotip diodes; forming a phosphor layer overlying the nanotip diode; and, forming a top electrode overlying the phosphor layer.

The nanotip diodes are formed by: forming a Si substrate with a top surface; forming a Si p-well; forming an n+ layer of Si, having a thickness in the range of 30 to 300 nanometers (nm), overlying the Si p-well; forming a RIE-induced polymer grass overlying the substrate top surface; using the RIE-induced polymer grass as a mask, etching areas of the substrate not covered by the mask; and, forming the nanotip diodes in areas of the substrate covered by the mask.

In one aspect, the phosphor layer is Si oxide, and is formed as follows: following the exposure of underlying regions of the p-well, removing the remaining RIE-induced polymer grass, exposing n+ Si regions; thermally oxidizing the exposed n+ and p-well Si regions; growing 1 to 5 nanometers (nm) of silicon oxide; and, depositing silicon oxide overlying the thermally-grown silicon oxide. Alternately, the phosphor can be a rare earth element-doped insulator, with the insulator being a material such as Si oxide or Si nitride.

In another aspect, a rare earth element such as erbium (Er) is diffused into the Si nanotips. After the nanotips are formed, an insulator with a rare earth doping density in the range of 1 atomic weight percentage (at %) to 5 at % is deposited as the phosphor layer. Then, thermal annealing is performed to diffuse the rare earth into the nanotips.

Additional details of the above-described method, and an EL device with nanotip diodes are provided below.

BRIEF DESCRIPTION OF THE DRAWINGS

FIG. 9 is a flowchart illustrating a method for fabricating a Si nanotip EL diode.

DETAILED DESCRIPTION

Figure 1:
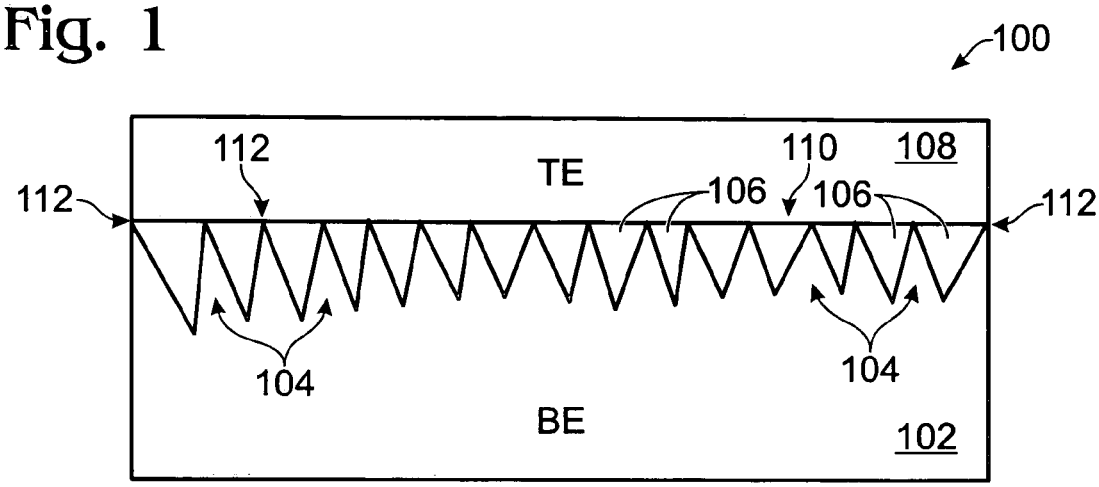
FIG. 1 is a partial cross-sectional view of a silicon nanotip electroluminescence (EL) diode.

FIG. 1 is a partial cross-sectional view of a silicon nanotip electroluminescence (EL) diode. The EL diode 100 comprises a bottom electrode (BE) 102 with a plurality of nanotip diodes 104, and a phosphor layer 106 overlying the nanotip diodes 104. A top electrode (TE) 108 overlies the phosphor layer 106. As shown, the phosphor layer 106 has a planar top surface 110 in the same plane as the nanotip diode ends 112. That is, the phosphor layer top surface 110 is formed as a result of a planarization process, such as a chemical-mechanical polish (CMP), that removes a portion of the deposited phosphor layer material down to, and including a small portion of the nanotip diode ends 112.

As used herein, the word "nanotip" is not intended to be limited to any particular physical characteristics, shapes, or dimensions. The nanotips may alternately be known as nanorods, nanotubes, or nanowires. In some aspects (not shown), the nanotips may form a hollow structure. In other aspects (not shown), the nanotips may be formed with a plurality of tips ends. Although the nanotip diodes 104 are shown substantially vertical, and therefore, perpendicular to the (horizontal) surfaces of the bottom electrode 102, the nanotips are not limited to any particular orientation with respect to the bottom electrode surfaces.

Figure 2:
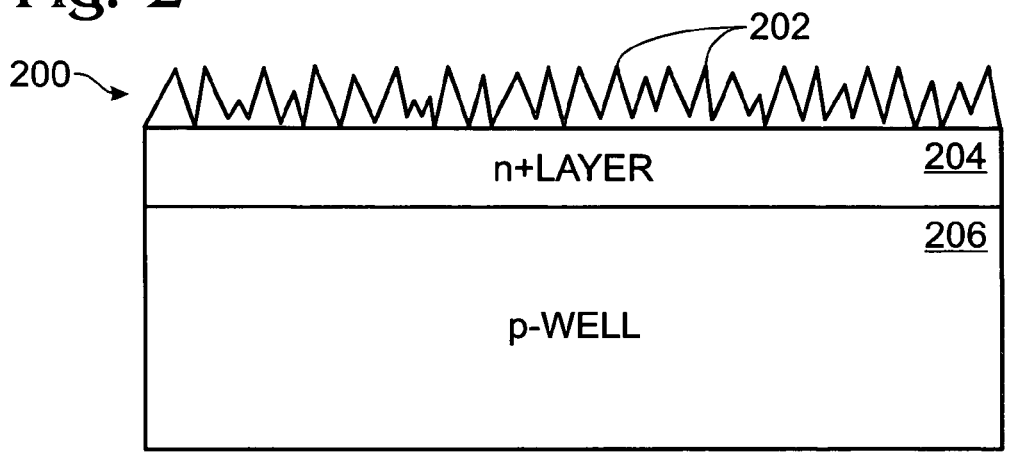
FIG. 2 is a partial cross-sectional view of the EL device of FIG. 1 in a fabrication step prior to completion.

FIG. 2 is a partial cross-sectional view of the EL device of FIG. 1 in a fabrication step prior to completion. A temporary RIE-induced polymer grass etch mask 200 is shown overlying an n+ layer of Si 204. The n+ layer 204 overlies a p-well 206. The nanotip diodes of FIG. 1 are subsequently located in areas underlying the temporary mask. That is, each nanotip diode is formed underlying a stump 202 in the mask 200. Additional details of the fabrication process are presented below.

Figure 3:
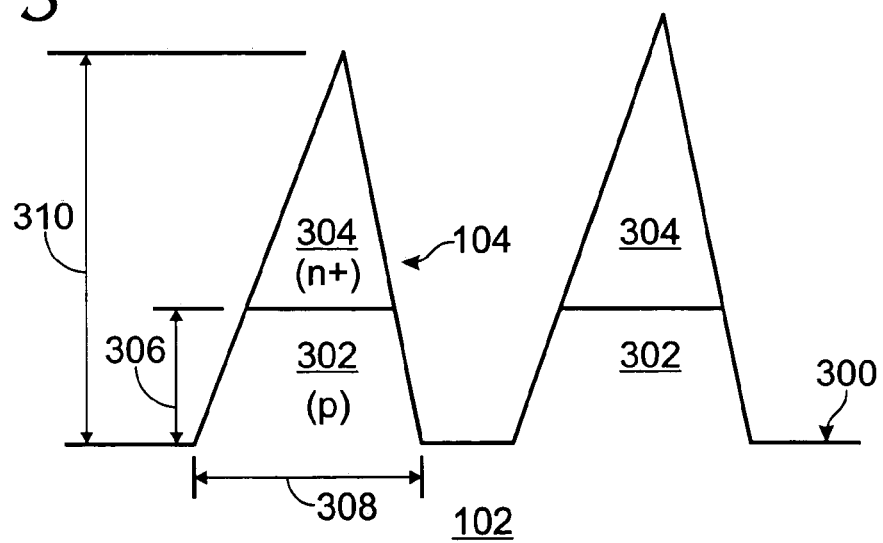
FIG. 3 is a partial cross-sectional view showing a detail of FIG. 1.

FIG. 3 is a partial cross-sectional view showing a detail of FIG. 1. The bottom electrode 102 includes a silicon (Si) top surface 300. Each nanotip diode 104 includes a p-doped Si lower tip 302 attached to the bottom electrode top surface 300, and an n+ Si upper tip 304 connected to the p-doped lower tip 302. Thus, each nanotip diode 104 is a p/n junction structure. The p-doped Si lower tip 302 has a length 306 longer than 2 nanometer (nm). The n+ doped Si upper tip 304 has a length of longer than 10 nm. Note, although the upper and lower tips are shown as approximately equal in length, they need not be so.

The nanotip diodes 104 have a base size 308 of about 50 nanometers, or less, and a height 310 in the range of 50 to 500 nm. The nanotip diodes 104 have a density of greater than 100 per square micrometer. That is, the number of nanotip diodes growing from a 1-square micrometer surface area of the bottom electrode 102 exceeds typically exceeds 100.

Returning to FIG. 1, in some aspects the phosphor layer 106 is a silicon oxide (SiOx, where x is less than 2) phosphor layer. For example, in one aspect the SiOx phosphor layer 106 is a silicon-rich silicon oxide (SRSO) layer. In other aspects, the phosphor layer 106 is a rare earth element-doped insulator where the rare earth is a material such as erbium (Er), ytterbium (Yb), cerium (Ce), praseodymium (Pr), or terbium (Tb). The insulator can be Si oxide or Si nitride. However, other conventional insulator materials may also be used. It should be understood that the EL device is not limited to any particular SiOx phosphor crystalline or doping limitations.

The top electrode 108 can be a material such as indium tin oxide (ITO), Zinc oxyfluoride, or a conductive plastic. Again however, other conventional transparent and non-transparent materials may be used as the top electrode.

Figure 4:
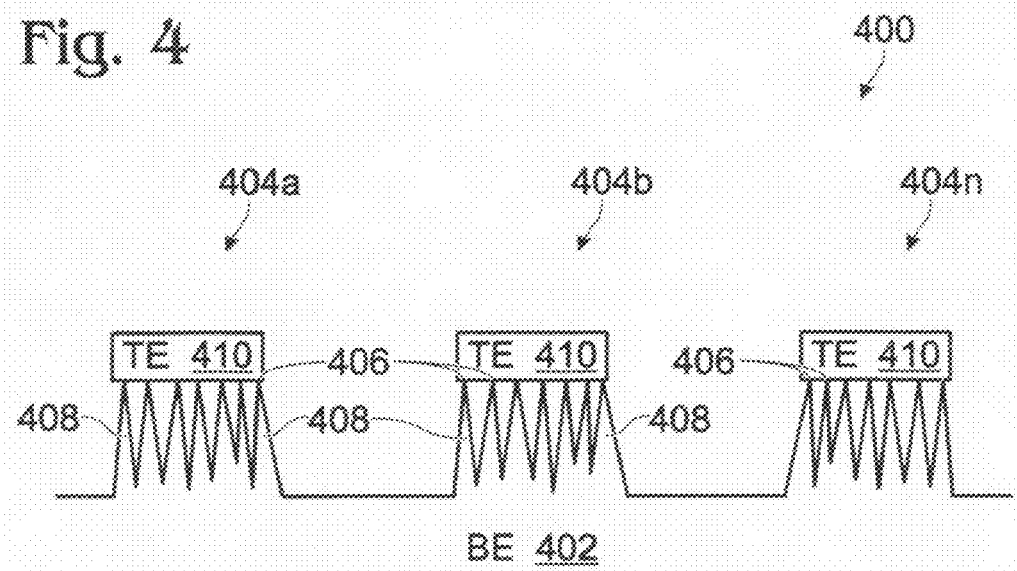
FIG. 4 is a partial cross-sectional view of a nanotip EL diode array.

FIG. 4 is a partial cross-sectional view of a nanotip EL diode array. The EL array 400 comprises a bottom electrode 402 with a plurality of isolated regions. Shown are isolated regions 404a, 404b, and 404n. However, the array is not limited to any particular number of regions. Each isolated region 404 comprises a plurality of nanotip diodes 406. A phosphor layer region 408 is deposited and CMP planarized to overlie each diode array region 400. An isolated top electrode 410 overlies each phosphor layer region 408.

The EL device of FIG. 1 may be considered to be an example of an isolated region 404 of the EL diode array 400. Although not specifically shown, each top electrode may be connected to an independent control line so that each section 400 of the EL diode array can be independently switched to emit light, or not. In this manner, the EL diode array 400 can be operated as a conventional LED array. In some aspects not shown, the bottom electrode is isolated into sections and a top electrode is formed common to all the sections. In other aspects, the bottom electrode can be n-doped silicon while the upper portion of the nanotips is p+ doped silicon.

Functional Description

Figure 5A:
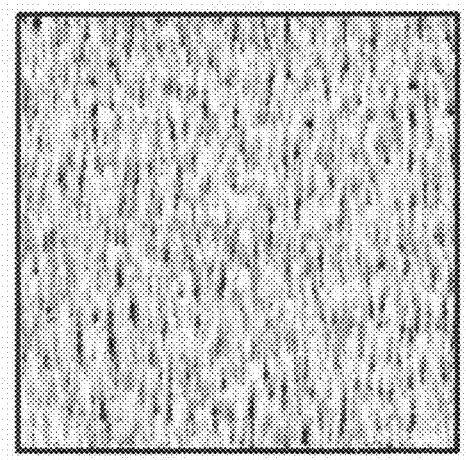
FIGS. 5A and 5B are photographs of Si nanotips formed by the polymer grass masked etch process.
Figure 5B:
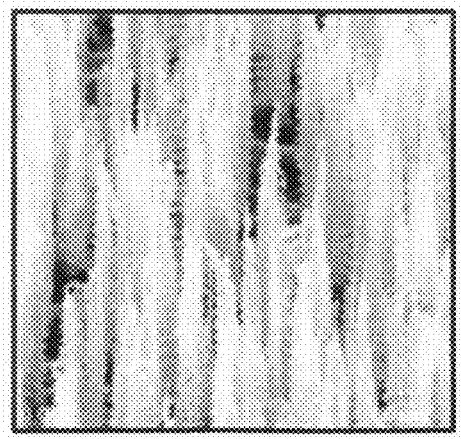

FIGS. 5A and 5B are photographs of Si nanotips formed by the polymer grass masked etch process.

Figure 6:
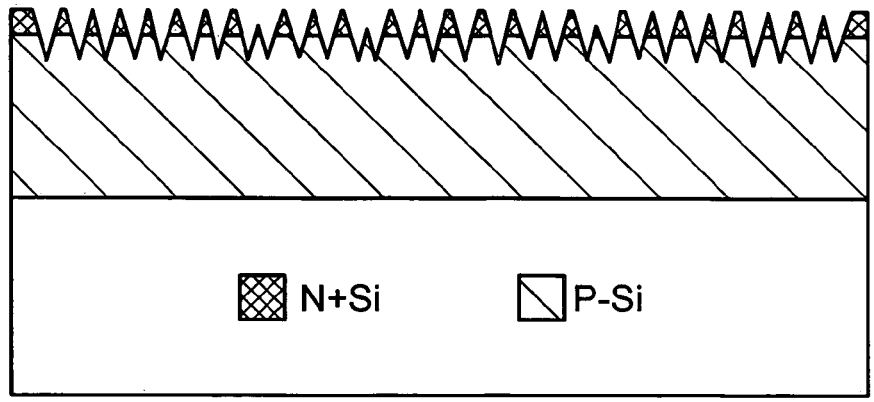
FIGS. 6 through 8 are partial cross-sectional views of steps in the fabrication of an EL device with nanotip diodes.
Figure 7:
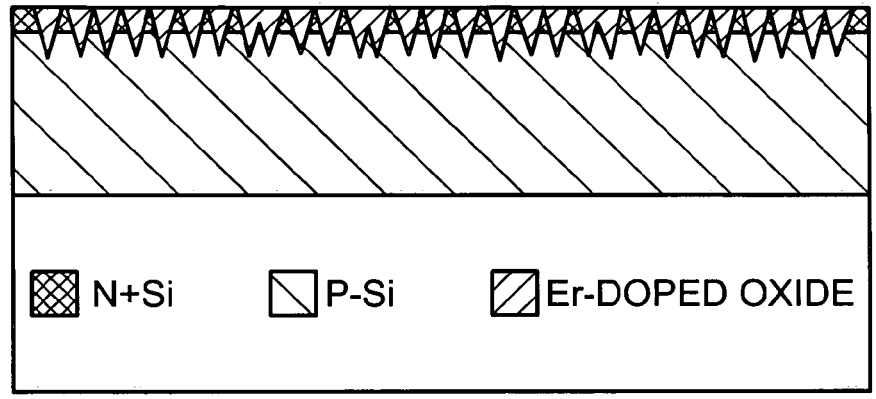
Figure 8:
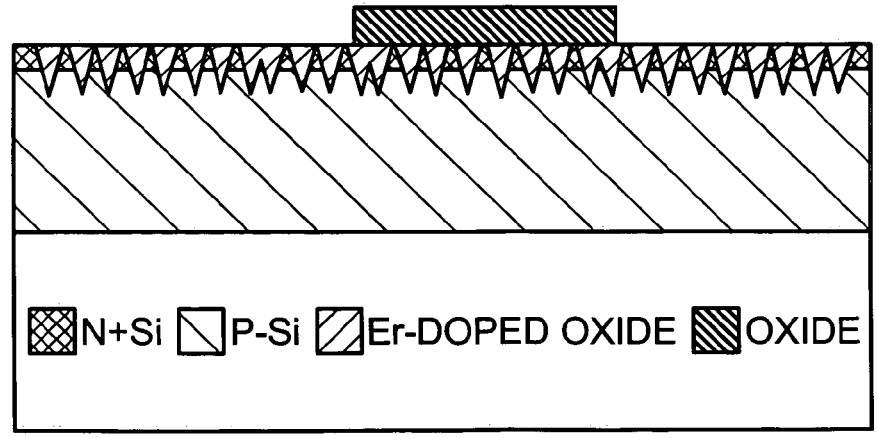

FIGS. 6 through 8 are partial cross-sectional views of steps in the fabrication of an EL device with nanotip diodes.

A first exemplary LED device fabrication process is preformed as follows:

1. Perform a conventional process for wafer cleaning and p-well formation. The p-well doping density is $10^{16}$ to $10^{18}/cm^3$.

2. Implant phosphorus (or arsenic) ions into the Si substrate. The energy is 50 keV (100 keV-arsenic) to 100 keV 3. Etch the silicon using oxygen and carbon tetrafluoride mixture under radio frequency excitation. This is known to form polymer on the silicon surface. The polymer in this case is usually called "grass". Any etching chemistry that introduces polymer deposition may be used. The etch time is from 10 seconds to 5 minutes. A shorter time yields smaller silicon nanotips.

4. Use the deposited polymer in step 3 as mask to etch silicon. The chemistry is $SF_6$ and $C_4F_8$. The etching depth has to be deeper than the n+ top silicon layer. In one aspect, equal amounts of p-doped Si and n+ Si are exposed. See FIG. 6.

5. Deposit a rare earth element (e.g. erbium)-doped silicon oxide, such as TEOS, by a chemical vapor deposition (CVD) or spin coating process. The Er-doped silicon oxide can be replaced with any Er-doped insulator. The Er doping density is 1 at % to 5 at %.

6. Thermal anneal at temperature from 600° C. to 1200° C. for 10 minutes to 200 minutes.

7. CMP to expose the top of the silicon nanotips. See FIG. 7.

8. Deposit and etch top electrode. See FIG. 8.

During Step 6 the surface of the silicon nanotips is oxidized and Er diffuses from the Er-doped oxide into Si nanotips. Although the solid solubility of Er in silicon is relatively low. The Er density at the silicon nanotips is about the same as the Er density in the oxide. That is about 1 at % to 5 at %. Therefore, the silicon nanotip diodes have Si═O and Er radiative centers.

A second exemplary LED device fabrication process is as follows:

Steps 1-4 are the same as the first exemplary process.

5. Thermally oxidize the wafer to grow 1 to 5 nm of thermal oxide.

6. Deposit silicon oxide and CMP to expose the top of the nanotip diodes.

7. Deposit and etch electrode.

The light emitting properties of the nanotips diodes may be further enhanced by implanting Er, or some other rare earth element, into the nanotips diodes after Step 5 or 6.

The structure formed by the first exemplary process is similar to that described in the second, except that in the first process the surface of the silicon nanotips are passivated with erbium-doped TEOS. The surface of the silicon nanotips becomes heavily doped with Er fusing from the Er-doped TEOS diffusion source.

FIG. 9 is a flowchart illustrating a method for fabricating a Si nanotip EL diode. Although the method is depicted as a sequence of numbered steps for clarity, the ordering of the steps does not necessarily follow the numbering. It should be understood that some of these steps may be skipped, performed in parallel, or performed without the requirement of maintaining a strict order of sequence. Some details of the method may be better understood in context of the explanations of FIGS. 1-8, above. The method starts at Step 900.

Step 902 forms a plurality of Si nanotip diodes. Step 904 forms a phosphor layer overlying the nanotip diodes. Step 906 forms a top electrode overlying the phosphor layer. In one aspect, forming nanotip diodes in Step 902 includes forming nanotip diodes with ends. Then, Step 905, following the forming of the phosphor layer, chemical-mechanical polishes (CMPs) the phosphor layer, exposing the nanotip diode ends.

In various aspects, Step 902 forms nanotip diodes having a base size of about 50 nanometers, or less, a height in the range of 50 to 500 nm, and a density of greater than 100 per square micrometer.

Forming the nanotip diodes in Step 902 may include substeps. Step 902a, prior to forming the RIE-induced polymer grass, forms a Si p-well. Step 902b forms an n+ layer of Si, having a thickness in the range of 30 to 300 nanometers (nm), overlying the Si p-well as follows: doping the Si substrate with a density in the range of $1\times10^{16}$ to $1\times10^{18}$ per cubic centimeter ($/cm^3$); and, implanting an ion such as phosphorus or arsenic, at an energy in the range of 20 keV to 100 keV. More generally, Step 902 can be said to form p/n junction nanotip structures.

Step 902c forms a reactive ion etching (RIE)-induced polymer grass overlying the substrate top surface. Step 902d, using the RIE-induced polymer grass as a mask, etches areas of the substrate not covered by the mask, and Step 902e forms the nanotip diodes in areas of the substrate (previously) covered by the mask.

In some aspects, forming the RIE-induced polymer grass in Step 902c includes: introducing a mixture of oxygen and carbon tetrafluoride; exciting the mixture using a radio frequency (RF); and, etching the Si substrate for a time in the range of 10 seconds to 5 minutes.

In other aspects, etching areas of the substrate using the RIE-induced polymer grass as a mask (Step 902d) includes: using $SF_6$ for etching and $C_4F_8$ for passivation; etching exposed portions of the n+ layer; and, exposing regions of the underlying p-well. For example, exposing regions of the underlying p-well may include etching into the p-well a depth greater than about 2 nm. The overall etch depth, through both n+ and p-well material, defines the nanotip height in some aspects of the method.

In one aspect, forming the phosphor layer in Step 904 includes forming a Si oxide (SiOx) phosphor layer. Then, Step 904 may include substeps. Step 904a, following the exposure of underlying regions of the p-well, removes the remaining RIE-induced polymer grass, exposing n+ Si regions. Step 904b thermally oxidizes the exposed n+ and exposed p-well Si regions. Step 904c grows 1 to 5 nm of silicon oxide, and Step 904d deposits silicon oxide overlying the thermally grown silicon oxide.

In another aspect, forming the phosphor layer in Step 904 includes forming a rare earth element-doped insulator where the rare earth is a material such as Er, Yb, Ce, Pr, or Tb, and the insulator is a material such as Si oxide or Si nitride.

In a different aspect, forming the phosphor layer includes alternate substeps. Step 904d deposits an insulator with a rare earth doping density in the range of 1 at % to 5 at %. Step 904e thermally anneals at a temperature in the range of 600° C. to 1200° C. for a time in the range of 10 to 200 minutes.

In one aspect, forming the top electrode in Step 906 includes forming a top electrode from a material such as indium tin oxide (ITO), Zinc oxyfluoride, or conductive plastics.

The above-described method steps also apply to the fabrication of an EL diode array. Then, Step 902 forms a plurality of isolated regions, each region including a plurality of nanotip diodes. Step 904 forms a phosphor layer region overlying each region of nanotip diodes. Step 906 forms an isolated top electrode overlying each phosphor layer region.

An EL device made with a nanotip diode, and a corresponding fabrication process has been provided. Specific materials and fabrication details have been given as examples to help illustrate the invention. However, the invention is not limited to merely these examples. Other variations and embodiments of the invention will occur to those skilled in the art.

We claim:

1. A method for fabricating a silicon (Si) nanotip electroluminescence (EL) diode, the method comprising:

forming a plurality of Si nanotip diodes, where each nanotip diode is p/n junction nanotip structure, as follows:
  forming a reactive ion etching (RIE)-induced polymer grass overlying a top surface of the substrate;
  using the RIE-induced polymer grass as a mask, etching areas of the substrate not covered by the mask as follows:
    etching using $SF_6$ and $C_4F_8$ chemistries;
    etching exposed portions of a Si n+ layer; and exposing regions of the underlying Si p-well; and
    forming the nanotip diodes in areas of the substrate covered by the mask;
forming a Si oxide phosphor layer overlying the nanotip diodes as follows:
  following the exposure of underlying regions of the p-well, removing the remaining RIE-induced polymer grass, exposing n+ Si regions;
  thermally oxidizing the exposed n+ and exposed p-well Si regions;
  growing 1 to 5 nanometers (nm) of silicon oxide; and
  depositing silicon oxide overlying the thermally grown silicon oxide; and
forming a top electrode overlying the Si phosphor layer.

2. The method of claim 1 wherein forming the nanotip diodes includes:
  prior to forming the RIE-induced polymer grass, forming a Si p-well; and,
  forming an n+ layer of Si, having a thickness in the range of 30 to 300 nanometers (nm), overlying the Si p-well as follows:
    doping the Si substrate with a density in the range of $1\times10^{16}$ to $1\times10^{18}$ per cubic centimeter ($/cm^3$); and
    implanting an ion selected from the group including phosphorus and arsenic at an energy in the range of 20 keV to 100 keV.

3. The method of claim 2 wherein forming the RIE-induced polymer grass includes:
  introducing a mixture of oxygen and carbon tetrafluoride;
  exciting the mixture using a radio frequency (RF); and
  etching the Si substrate for a time in the range of 10 seconds to 5 minutes.

4. The method of claim 1 wherein exposing regions of the underlying p-well includes etching into the p-well a depth greater than about 2 nanometers (nm).

5. The method of claim 1 wherein forming the phosphor layer includes forming a rare earth element-doped insulator where the rare earth is selected from the group including erbium (Er), ytterbium (Yb), cerium (Ce), praseodymium (Pr), and terbium (Tb), and the insulator is a material selected from the group including Si oxide and Si nitride.

6. The method of claim 5 wherein forming the phosphor layer includes:
  depositing an insulator with a ram earth doping density in the range of 1 at % (atomic weight %) to 5 at %; and
  thermal annealing at a temperature in the range of 600° C. to 1200° C. for a time in the range of 10 to 200 minutes.

7. The method of claim 1 wherein forming nanotip diodes includes forming nanotip diodes with ends; and
  the method further comprising:
  following the forming of the phosphor layer, chemical-mechanical polishing (CMPing) the phosphor layer, exposing the nanotip diode ends.

8. The method of claim 1 wherein forming the top electrode includes forming a top electrode from a material selected from the group including indium tin oxide (ITO), Zinc oxyfluoride, and conductive plastics.

9. The method of claim 1 wherein forming nanotip diodes includes forming nanotip diodes having a base size of about 50 nanometers, or less.

10. The method of claim 1 wherein forming the nanotip diodes includes forming nanotip diodes having a height in the range of 50 to 500 nm.

11. The method of claim 1 wherein forming the nanotip diodes includes forming nanotip diodes having a density of greater than 100 per square micrometer.

12. The method of claim 1 wherein forming the plurality of Si nanotip diodes includes forming a plurality of isolated regions, each region including a plurality of nanotip diodes;
  wherein forming the phosphor layer overlying the nanotip diodes includes forming a phosphor layer legion overlying each region of nanotip diodes; and
  wherein forming a top electrode overlying the phosphor layer includes forming an isolated top electrode overlying each phosphor layer region.

* * * * *